(12) United States Patent
Choi

(10) Patent No.: US 11,417,577 B2
(45) Date of Patent: Aug. 16, 2022

(54) SEMICONDUCTOR PACKAGE AND METHOD OF MANUFACTURING THE SAME

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 0 days.

(21) Appl. No.: 17/227,351

(22) Filed: Apr. 11, 2021

(65) Prior Publication Data

US 2021/0366799 A1 Nov. 25, 2021

(30) Foreign Application Priority Data

May 21, 2020 (KR) ........................ 10-2020-0060997

(51) Int. Cl.

| | | |
|---|---|---|
| *H01L 23/14* | (2006.01) | |
| *B23K 20/10* | (2006.01) | |
| *H01L 23/13* | (2006.01) | |
| *H01L 23/00* | (2006.01) | |
| *B23K 101/40* | (2006.01) | |

(52) U.S. Cl.
CPC .............. *H01L 23/14* (2013.01); *B23K 20/10* (2013.01); *H01L 23/13* (2013.01); *H01L 24/32* (2013.01); *H01L 24/40* (2013.01); *H01L 24/48* (2013.01); *B23K 2101/40* (2018.08); *H01L 2224/32221* (2013.01); *H01L 2224/40175* (2013.01); *H01L 2224/48175* (2013.01)

(58) Field of Classification Search
CPC ..... B23K 20/10; B23K 2101/40; H01L 24/32; H01L 24/40
See application file for complete search history.

(56) References Cited

FOREIGN PATENT DOCUMENTS

| KR | 10-2001-0111736 A | 12/2001 |
|---|---|---|
| KR | 10-0528437 B1 | 11/2005 |
| KR | 10-0685253 B1 | 2/2007 |
| KR | 10-2010-0041889 A | 4/2010 |
| KR | 10-1113438 B1 | 2/2012 |
| KR | 10-1224799 B1 | 1/2013 |
| KR | 10-2013-0045596 A | 5/2013 |
| KR | 10-1643332 B1 | 7/2016 |
| KR | 10-1682067 B1 | 12/2016 |
| KR | 10-2019-0085587 A | 7/2019 |
| KR | 10-2228945 B1 | 3/2021 |

*Primary Examiner* — Robert G Bachner
(74) *Attorney, Agent, or Firm* — Park, Kim & Suh, LLC

(57) ABSTRACT

Provided is a semiconductor package including: at least one first substrate including at least one first substrate terminal extended therefrom; at least one second substrate joined to the upper surface of the first substrate using ultrasonic welding; at least one semiconductor chip joined to the upper surface of the second substrate; a package housing covering the at least one semiconductor chip and an area of the second substrate, where ultrasonic welding is performed; and terminals separated from the first substrate, electrically connected to the at least one semiconductor chip through electric signals, and at least one of them is exposed to the outside of the package housing, wherein a thickness of the terminals formed inside the package housing is same as or smaller than a thickness of the first substrate and the second substrate includes at least one embossing groove on the upper surface thereof.

20 Claims, 25 Drawing Sheets

SEMICONDUCTOR PACKAGE AND METHOD OF MANUFACTURING THE SAME

CROSS-REFERENCE TO RELATED PATENT APPLICATION

This application claims the benefit of Korean Patent Application No. 10-2020-0060997, filed on May 21, 2020, in the Korean Intellectual Property Office, the disclosure of which is incorporated herein in its entirety by reference.

BACKGROUND OF THE INVENTION

Field of the Invention

The present invention relates to a semiconductor package and a method of manufacturing the same, wherein the semiconductor package includes first and second substrates formed of a material that enables ultrasonic welding so that the substrates are joined to each other to lighten weight and thereby, battery consumption and the cost of material may be finally reduced after being applied to electric vehicles.

Description of the Related Art

In general, since a package type power semiconductor device radiates heat at an unnecessarily high-temperature environment due to electric power generated while driving, it is important to cool down the temperature to an optimum level and to minimize thermal resistance.

As a related prior art, Korean Patent Publication No. 0685253 discloses a package type power semiconductor package. As illustrated in FIG. 1, in a general package type power semiconductor package, a power semiconductor die 26 is soldered to a direct bonded copper (DBC) substrate 28, wherein the DBC substrate 28 includes a die-sided first copper layer 30, a ceramic layer 32, and a rear-sided second copper layer 34, and a sealing layer 36 is formed on the upper side of a device conducting wire 38 soldered 40 to the power semiconductor die 26, the DBC substrate 28, and the first copper layer 30.

However, the conducting wire 38, which is a lead frame lead, and the die-sided first copper layer 30 are soldered and joined to each other and structural joining strength thereof may be lowered while being modified at a high-temperature environment. Also, the die-sided first copper layer 30, which is a thermal diffusion layer, the ceramic layer 32, and the rear-sided second copper layer 34 are entered and molded into the sealing layer 36 so that there is a limit in heat radiation effect and reliability of a semiconductor chip may be lowered due to stress applied to the power semiconductor die 26 while being modified by temperature characteristic of the thermal diffusion layer.

Also, in order to improve thermal efficiency of a semiconductor, a thick copper material is generally used to join a semiconductor chip and to radiate heat. However, the cost of a copper material is high and the weight of a semiconductor package itself increases due to weight increased according to a thickness of a copper material. As a result, when the semiconductor package is applied to electric vehicles, battery consumption increases.

Therefore, technologies are required to effectively radiate heat generated from a semiconductor chip to the outside of a package housing to cool down, to minimize modification of a semiconductor package, and to reduce the weight of a semiconductor package and manufacturing costs.

SUMMARY OF THE INVENTION

The present invention provides a semiconductor package and a method of manufacturing the same, wherein the semiconductor package includes first and second substrates formed of a material that enables ultrasonic welding so that the substrates are joined to each other to lighten weight and thereby, battery consumption and the cost of material may be finally reduced after being applied to electric vehicles.

According to an aspect of the present invention, there is provided a semiconductor package including: at least one first substrate including at least one first substrate terminal extended therefrom; at least one second substrate joined to the upper surface of the first substrate using ultrasonic welding; at least one semiconductor chip joined to the upper surface of the second substrate; a package housing covering the at least one semiconductor chip and an area of the second substrate, where ultrasonic welding is performed; and terminals separated from the first substrate, electrically connected to the at least one semiconductor chip through electric signals and at least one of them is exposed to the outside of the package housing, wherein a thickness of the terminals formed inside the package housing is same as or smaller than a thickness of the first substrate and the second substrate includes at least one embossing groove on the upper surface thereof.

According to another aspect of the present invention, there is provided a semiconductor package including: at least one first substrate; at least one second substrate joined to the upper surface of the first substrate using ultrasonic welding and including second substate terminals extended therefrom; at least one semiconductor chip joined to the upper surface of the first substrate or the upper surface of the second substrate; a package housing covering the at least one semiconductor chip and an area of the second substrate, where ultrasonic welding is performed; and terminals separated from the first substrate, electrically connected to the at least one semiconductor chip through electric signals, and at least one of them is exposed to the outside of the package housing, wherein a thickness of the terminals formed inside the package housing is same as or smaller than a thickness of the first substrate and the second substrate includes at least one embossing groove on the upper surface thereof.

The first substrate or the second substrate may include a conductive metal.

The conductive metal may have a stacked structure including at least two layers formed of each different metal or each different alloy metal.

The first substrate or the second substrate may include an insulation layer where at least one layer is stacked.

The first substrate, the first substrate terminal, or both the first substrate and the first substrate terminal may be formed of Al as a single material or an alloy material containing more than 50% of Al.

The second substrate, the second substate terminal, or both the second substrate and the second substate terminal may be formed of Cu as a single material or an alloy material containing more than 50% of Cu.

The at least one terminal may be formed of Al or Cu as a single material or an alloy material containing more than 50% of Al or Cu.

The first substrate, the second substrate, both first substrate and second substrate, the first substrate terminal, a second substate terminal, or the at least one terminal may each include a plated layer on at least one surface thereof. Here, the plated layer may be formed of a single layer or may have a stacked structure including two or more layers formed of a same metal or each different metal.

Also, the plated layer may be a single layer including Ni as a single material or a Ni plated layer where one or more layers formed of an alloy material containing more than 70% of Ni are stacked. Here, a thickness of the Ni plated layer may be 0.1 µm to 10 µm.

The most outer plated layer of the at least one terminal may contain Sn.

The semiconductor chip may be joined to the upper surface of the second substrate by using a conductive adhesive interposed therebetween.

At least a part of the conductive adhesive may be applied to the embossing grooves disposed on the surface of the second substrate.

The conductive adhesive may be a solder-related material containing at least any one of Sn, Pb, and Bi or a sinter material containing at least any one of Ag and Cu.

The electric signals may be wires or metal clips.

The at least one terminal may be arranged to be spaced apart from the upper surface of the first substrate at a regular interval.

The at least one terminal may be overlapped with the upper surface of the first substrate and instead, may be physically separated from the first substrate.

The first substrate and the second substrate may be formed of a conductive metal containing each different component.

The first substrate, the first substrate terminal, and the terminal may be formed of Al as a single material or an alloy material containing more than 50% of Al.

The second substrate may be formed of Al as a single material or an alloy material containing more than 50% of Al.

An area of the first substrate may be greater than an area of the second substrate.

A thickness of the first substrate may be greater than a thickness of the second substrate.

A part of the lower surface of the first substrate or the entire first substrate may be exposed to the lower surface of the package housing.

A penetration hole used to combine with a heat sink may be formed on the first substrate, where the second substrate or the semiconductor chip is not joined thereto.

A thickness of the first substrate or the second substrate may be same as a thickness of the terminal, where the plated layer is excepted.

A depth of the embossing grooves may be below 100 µm.

The embossing grooves may have cross-sections of a V-letter shape, a U-letter shape, or a polygon.

The embossing grooves may have a grid-form, a dotted-form, or line-forms.

At least one burr may be formed around the at least one embossing groove. A height of the burr may be formed not to exceed 100 µm.

According to another aspect of the present invention, there is provided a method of manufacturing the semiconductor package described above.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
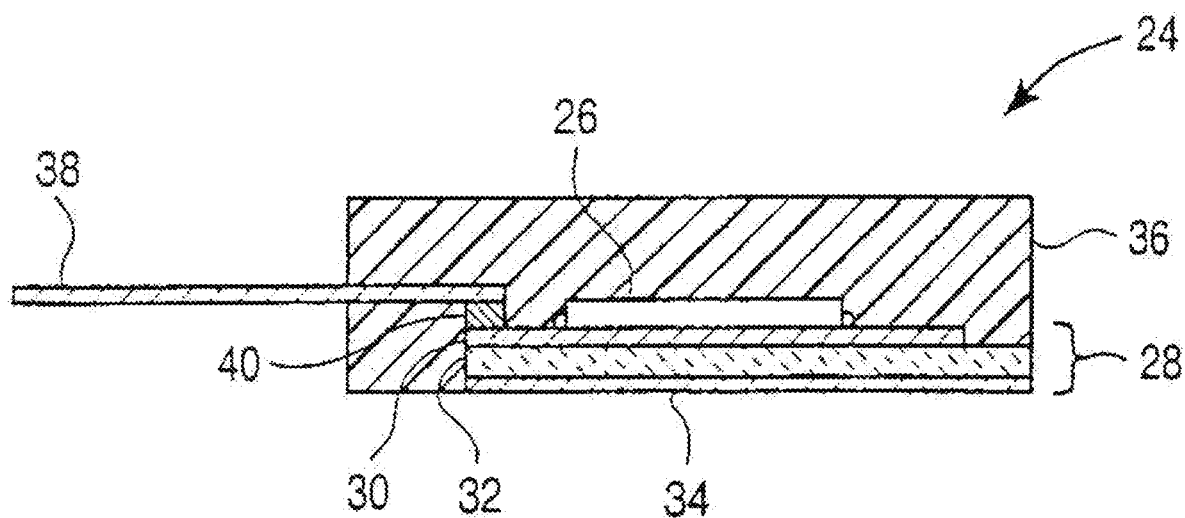
FIG. 1 illustrates a heat slug and a lead frame junction semiconductor package using ultrasonic welding according to a conventional art.

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

Referring to FIGS. 2A through 4E, a semiconductor package according to an embodiment of the present invention includes at least one first substrate 110, at least one second substrate 120, at least one semiconductor chip 130, a package housing 140, and terminals 150, wherein the at least one first substrate 110 includes at least one first substrate terminal 111 extended therefrom, the at least one second substrate 120 is joined to the upper surface of the first substrate 110 using ultrasonic welding, the at least one semiconductor chip 130 is joined to the upper surface of the second substrate 120, the package housing 140 covers the at least one semiconductor chip 130 and an area of the second substrate 120, where ultrasonic welding is performed, and the terminals 150 are separated from the first substrate 110, electrically connected to the at least one semiconductor chip 130 through electric signals 151, and at least one of them is exposed to the outside of the package housing 140. Here, a thickness of the terminals 150 formed inside the package housing 140 is same as or smaller than a thickness of the first substrate 110 and at least one embossing groove 122 is formed on the upper surface of the second substrate 120. Accordingly, the first substrate 110 and the second substrate 120, which are separated from each other, are formed of a material that enables ultrasonic welding. Thus, the first substrate 110 and the second substrate 120 are joined to each other to lighten weight, a size of the first substrate 110 increases to improve heat radiation effect, and a joining strength between the semiconductor chip 130 and the second substrate 120 increases by the embossing grooves 122.

Figure 4A:
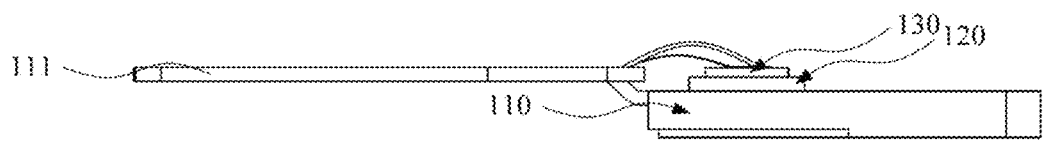
FIGS. 4A to 4E are side views of the semiconductor package of FIGS. 2A to 2C.
Figure 4B:
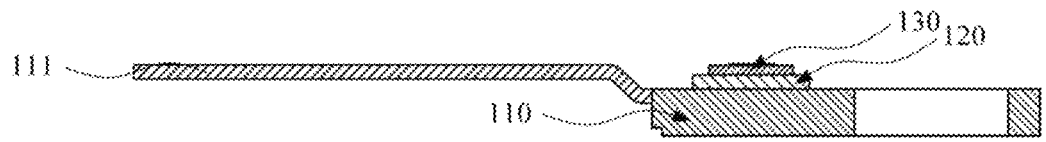

Firstly, the at least one first substrate 110 includes the at least one first substrate terminal 111 extended from one end thereof, wherein the first substrate terminals 111 may be extended at the same height as the upper surface of the first substrate 110 or may be inclined and bent toward an upper direction from the upper surface of the first substrate 110, as illustrated in FIG. 4B.

Figure 2A:
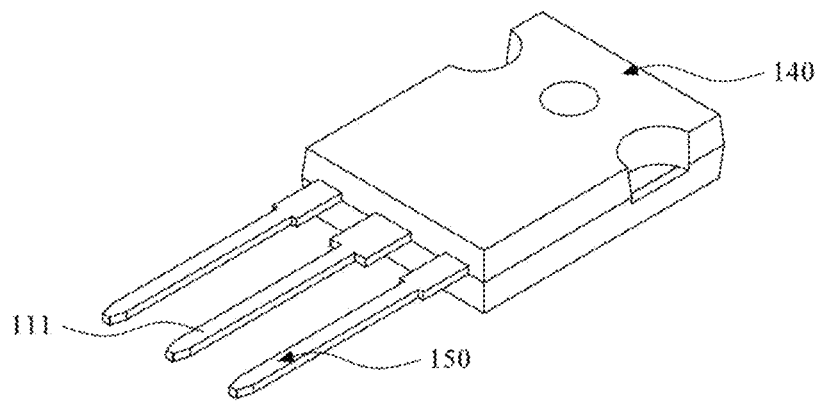
FIGS. 2A to 2C are perspective views of a semiconductor package according to an embodiment of the present invention.
Figure 2B:
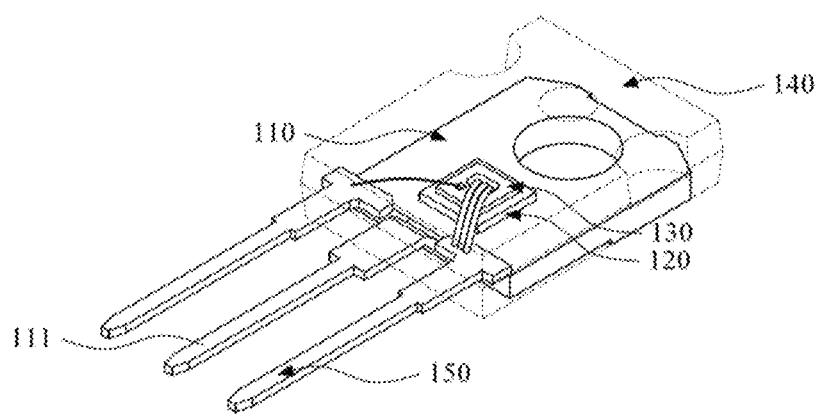
Figure 2C:
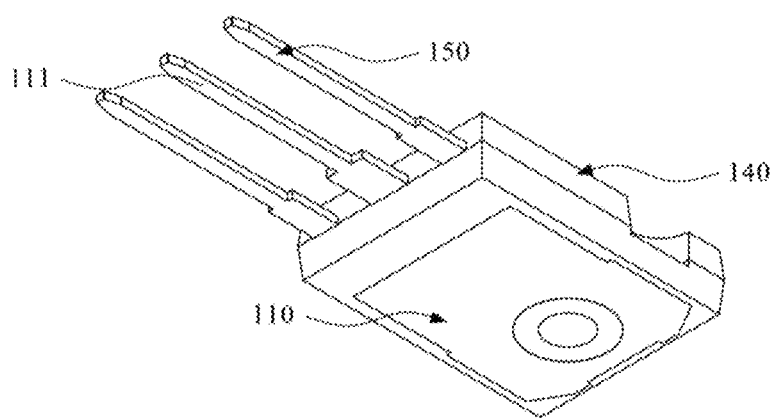

As illustrated in FIG. 2A to 2C, one ends of the first substrate terminal 111 are exposed to the outside of the package housing 140 and are electrically connected to external terminals.

Here, the first substrates 110, the first substrate terminals 111, or both the first substrate 110 and the first substrate terminal 111 may be formed of Al as a single material or an alloy material containing more than 50% of Al. Accordingly, the second substrate 120 including a Cu material is joined to the upper surface of the first substrate 110 by using ultrasonic welding and thus, the first substrates 110, the first substrate terminals 111, or both the first substrate 110 and the first substrate terminal 111 described above may replace the first substrate 110 or the first substrate terminal 111, which is generally formed of a copper material. Therefore, weight lightening may be realized and the cost of material may be reduced.

Next, the at least one second substrate 120 is joined to the upper surface of the first substrate 110 by using the ultrasonic welding.

Here, the ultrasonic welding is a way that is suitable for welding of Al or a copper laminate, wherein pressurizing and joining are performed through frictional heat generated by high frequency vibrational energy from an ultrasonic welding machine so that deformation of joined parts may be minimized and post-processing of a surface treatment may be skipped. Accordingly, productivity may be increased.

The first substrate 110 or the second substrate 120 may include a conductive metal, wherein the conductive metal may have a stacked structure including at least two layers formed of each different metal or each different alloy metal.

Also, the first substrate 110 or the second substrate 120 may have a stacked structure including at least one insulation layer.

For example, the second substrate 120 may be formed of Cu as a single material or an alloy material containing more than 50% of Cu.

The first substrate 110 and the second substrate 120 may be formed of a conductive metal containing each different component.

In addition, an area of the first substrate 110 is formed to be greater than an area of the second substrate 120 or a thickness of the first substrate 110 is formed to be greater than a thickness of the second substrate 120. As illustrated in FIG. 2C, a part of the lower surface of the first substrate 110 or the entire first substrate 110 is exposed to the lower surface of the package housing 140. Accordingly, heat generated from the semiconductor chip 130 may be effectively radiated to the outside of the package housing 140.

Figure 3A:
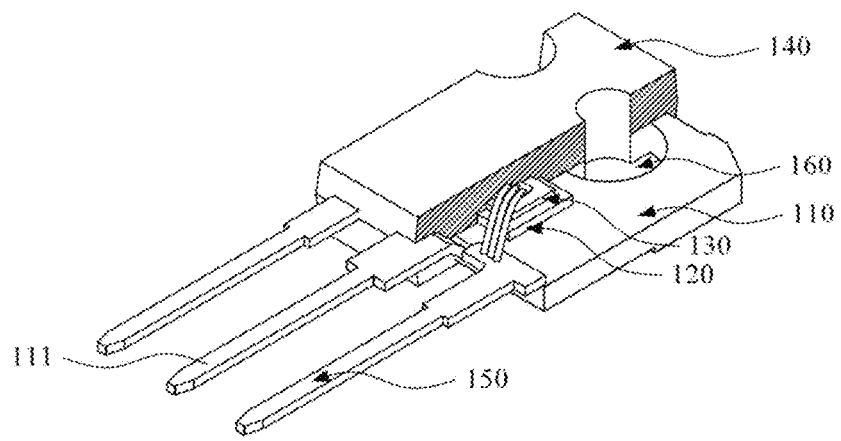
FIGS. 3A to 3C are exploded perspective views of the semiconductor package of FIGS. 2A to 2C.

As illustrated in FIG. 3A, a penetration hole 160 used to combine with a heat sink (not illustrated) may be formed to be connected with the package housing 140 on the first substrate 110 where the second substrate 120 or the semiconductor chip 130 is not joined thereto.

Next, the at least one semiconductor chip 130 is joined to the upper surface of the second substrate 120. As illustrated in FIG. 17C, the semiconductor chip 130 may be joined to the upper surface of the second substrate 120 by using a conductive adhesive 121 interposed therebetween.

The at least one embossing groove 122 is formed on the upper surface of the second substrate 120 and at least a part of the conductive adhesive 121 is applied to the embossing grooves 122 disposed on the surface of the second substrate 120. Accordingly, the joining strength between the second substrate 120 and the semiconductor chip 130 may be increased.

Here, the conductive adhesive 121 may be a solder-related material used in soldering containing at least any one of Sn, Pb, and Bi or a sinter material used in sintering containing at least any one of Ag and Cu.

Also, the embossing grooves 122 having a depth of below 100 μm may be formed by ultrasonic welding performed with respect to the second substrate 120 and as illustrated in FIGS. 17A to 18B, the embossing grooves 122 may be formed in various shapes. For example, cross-sections of a V-letter shape (FIG. 18A), a U-letter shape (FIG. 17C), or a polygon may be formed and surface areas of the embossing grooves 122 are maximized. Accordingly, the joining strength between the embossing grooves 122 and the conductive adhesive 121 may be increased.

Figure 17A:
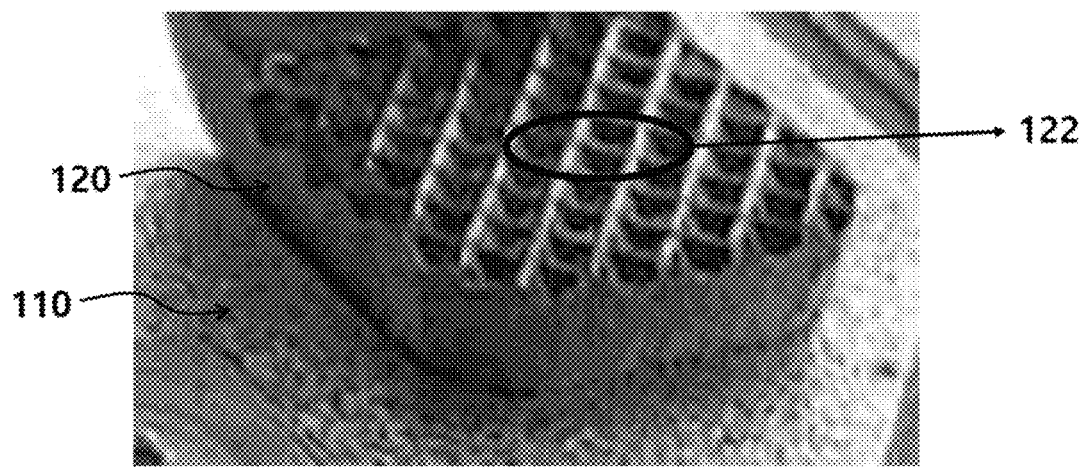
FIGS. 17A to 17C illustrate embossing grooves of a semiconductor package according to an embodiment of the present invention.
Figure 17B:
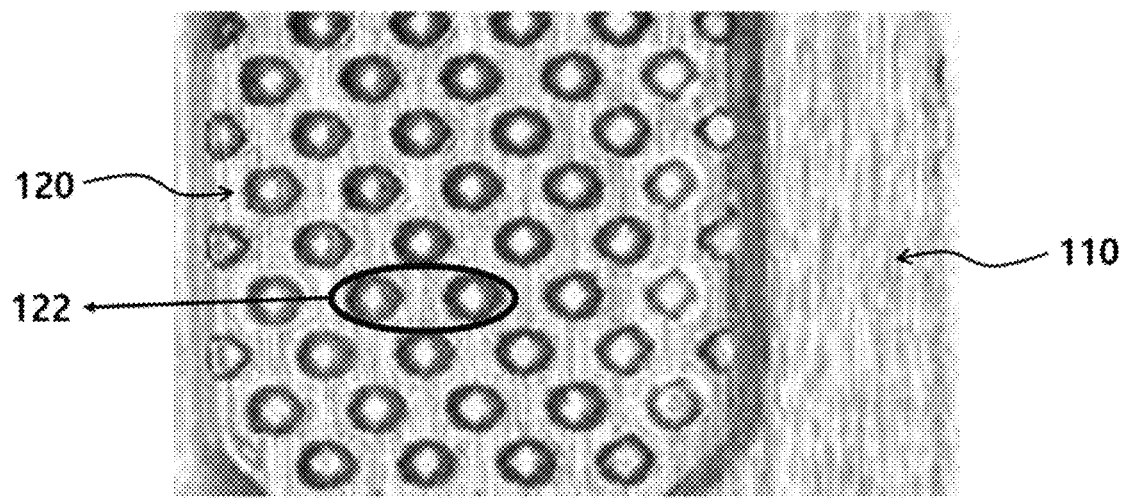
Figure 17C:

In addition, the embossing grooves 122 may have a grid-form as illustrated in FIG. 17A, a dotted-form as illustrated in FIG. 17B, or line-forms so that surface areas of the embossing grooves 122 are maximized and the joining strength between the embossing grooves 122 and the conductive adhesive 121 may be increased.

Figure 18A:
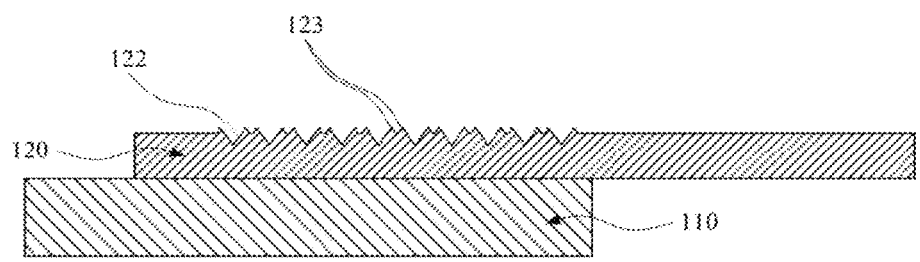
FIGS. 18A and 18B illustrate burrs formed in the embossing grooves of FIGS. 17A to 17C.
Figure 18B:
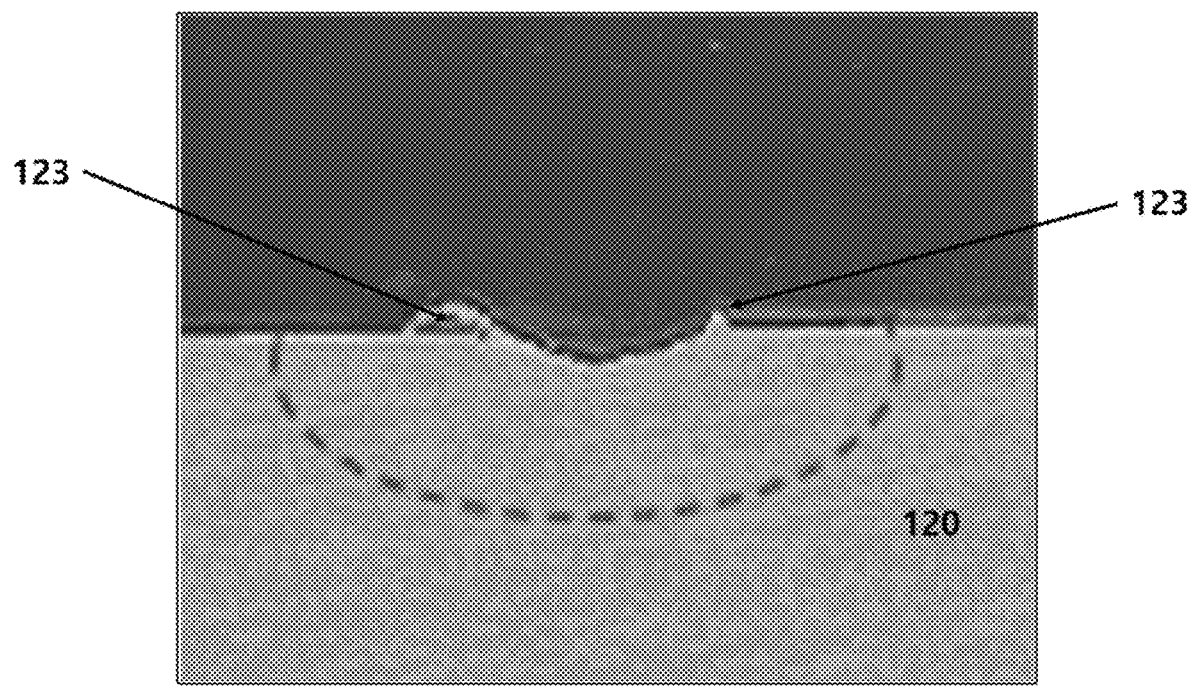

When the embossing grooves 122 are formed by ultrasonic welding performed with respect to the second substrate 120, burrs 123 are necessarily generated. As illustrated in FIG. 18B, at least one burr 123 may be formed around the at least one embossing groove 122 and a height of the burr 123 may be formed not to exceed 100 μm.

For reference, a silicon control rectifier (SCR), a power transistor, an insulated gate bipolar transistor (IGBT), a metal-oxide semiconductor field effect transistor (MOSFET), a power rectifier, a power regulator, or a power semiconductor including a combination thereof may be applied as the semiconductor chip 130.

Next, the package housing 140 covers the at least one semiconductor chip 130 and an area of the first substrate 110 and the second substrate 120, where ultrasonic welding is performed, wherein the package housing 140 is an insulator for protecting semiconductor circuits and may be formed using an epoxy molding compound (EMC), polyphenylene sulfide (PPS), or polybutylene terephthalate (PBT).

Then, the terminals 150 are physically separated from the first substrate 110, electrically connected to the at least one semiconductor chip 130 through the electric signals 151, and at least one of them is exposed to the outside of the package housing 140 so as to electrically connect to external terminals.

Figure 3B:
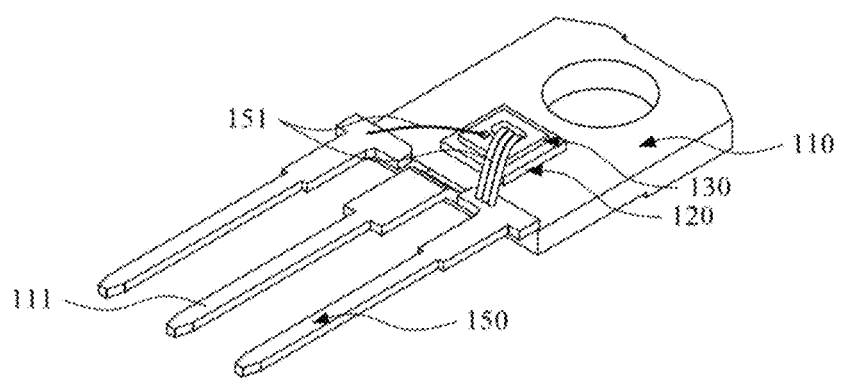
Figure 3C:
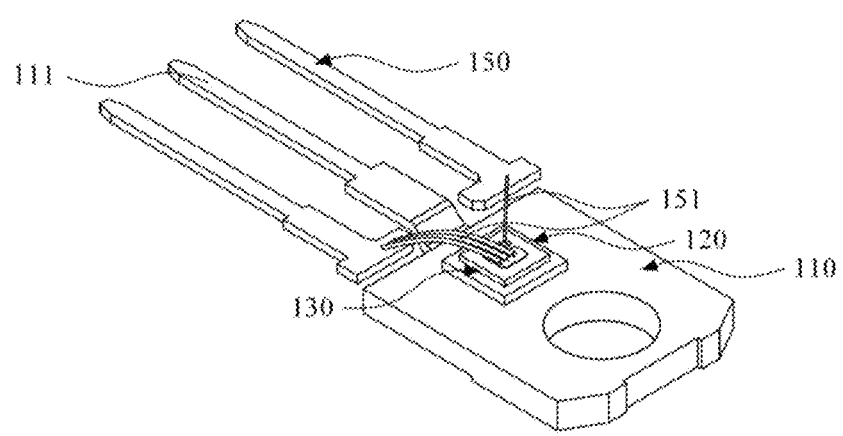
Figure 4C:
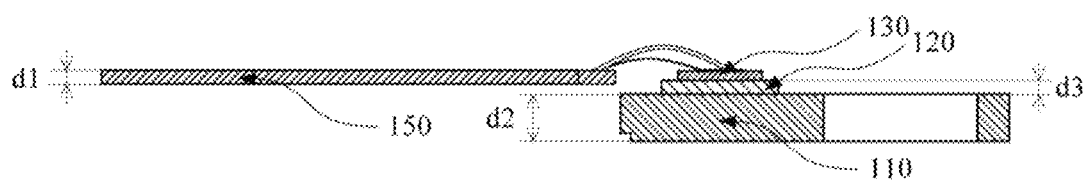
Figure 4D:
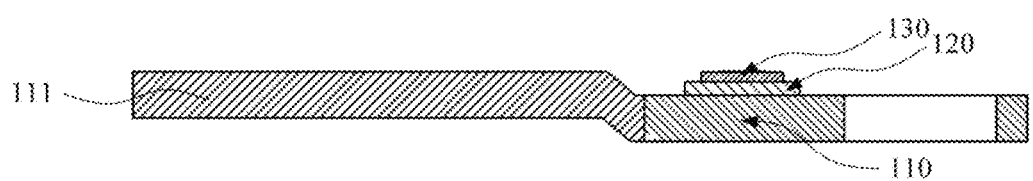

As illustrated in FIGS. 3C and 4C, the at least one terminal 150 may be arranged to be spaced apart from the upper surface of the first substrate 110 at a regular interval so as to be physically separated.

In addition, as illustrated in FIGS. 3A to 3C, the electric signals 151 may be wires or metal clips.

The first substrate 110, the first substrate terminal 111, and the terminal 150 may be formed of Al as a single material or an alloy material containing more than 50% of Al.

Figure 4E:
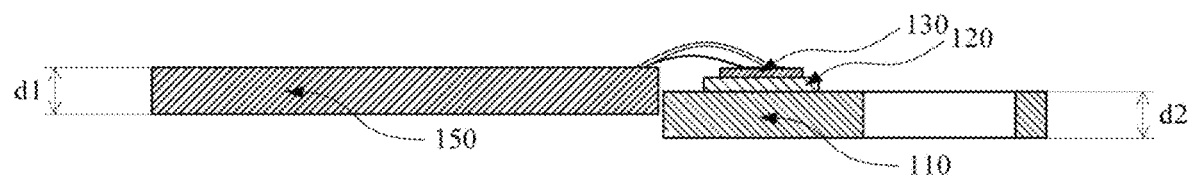
Figure 5A:
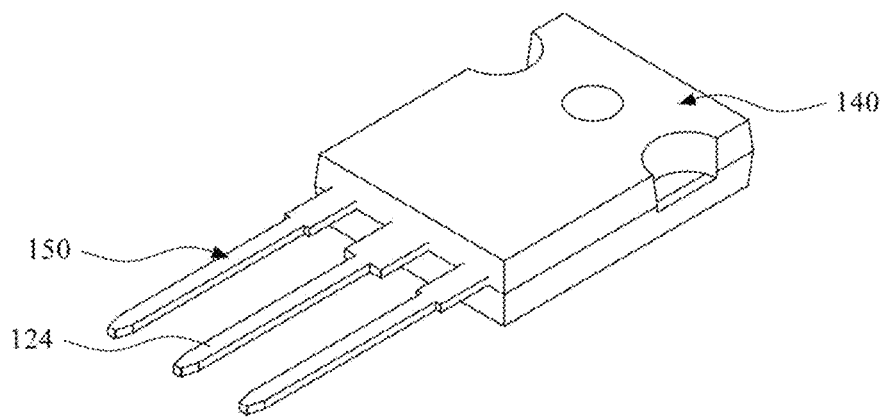
FIGS. 5A to 5C are perspective views illustrating a first example of a semiconductor package according to another embodiment of the present invention.
Figure 5B:
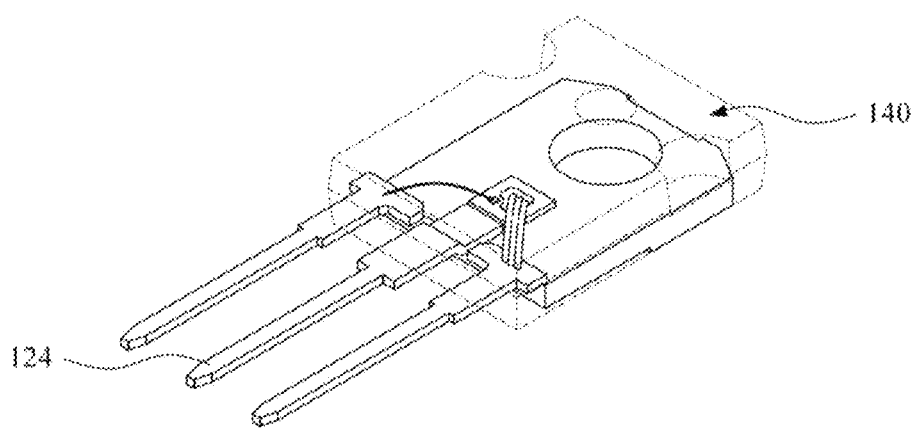
Figure 5C:
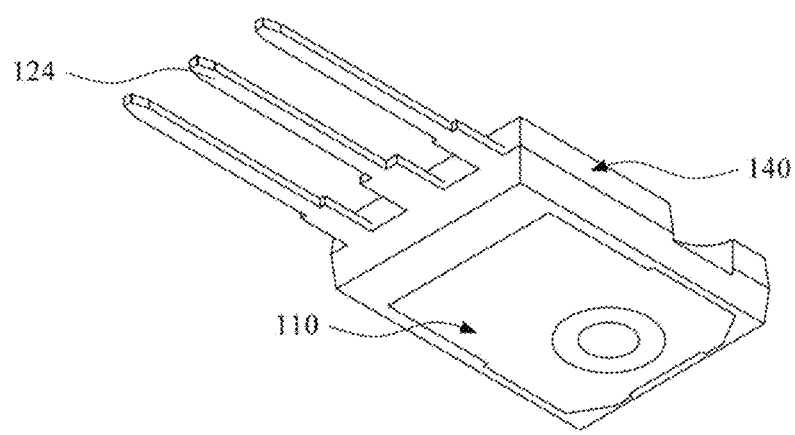

As illustrated in FIGS. 4C and 4E, a thickness d1 of the terminal 150 formed inside the package housing 140 may be formed to be smaller than (FIG. 4C) or same as (FIG. 4E) a thickness d2 of the first substrate 110.

Also, as illustrated in FIG. 4C, a thickness d3 of the second substrate 120 may be same as the thickness d1 of the terminal 150, where a plated layer is excepted, or as illustrated in FIG. 4E, the thickness d2 of the first substrate 110 may be same as the thickness d1 of the terminal 150, where a plated layer is excepted.

The at least one terminal 150 may be formed of Al or Cu as a single material or an alloy material containing more than 50% of Al or Cu.

The first substrate 110, the second substrate 120, both the first substrate 110 and the second substrate 120, the first substrate terminal 111, a second substate terminal 124, or the at least one terminal 150 may each include a plated layer on at least one surface thereof. Here, the plated layer may be formed of a single layer or may have a stacked structure including two or more layers formed of a same metal or each different metal.

Also, the plated layer may be a single layer including Ni as a single material or a Ni plated layer where one or more layers formed of an alloy material containing more than 70% of Ni are stacked. Here, a thickness of the Ni plated layer may be 0.1 μm to 10 μm.

The most outer plated layer of the at least one terminal 150 may contain Sn.

Accordingly, in the semiconductor package according to an embodiment of the present invention, instead of a substrate formed of a high-priced copper material, a material that enables ultrasonic welding is used to form the first substrate and the second substrate, which are separated from each other. Thus, the substrates are joined to each other to lighten weight and thereby, battery consumption and the cost of material may be finally reduced after being applied to electric vehicles. Also, the semiconductor chip may be installed on the second substrate, a size and a thickness of the substrate exposed to the outside of the package housing are relatively formed to be greater so as to improve heat radiation effect, and a joining strength between the semiconductor chip and the substrate may be increased by the embossing grooves and the burrs.

Referring to FIGS. 5A through 16, a semiconductor package according to another embodiment of the present invention includes the at least one first substrate 110, the at least one second substrate 120, the at least one semiconductor chip 130, the package housing 140, and the terminals 150, wherein the at least one second substrate 120 is joined to the upper surface of the first substrate 110 using ultrasonic welding and includes the second substate terminals 124 extended therefrom, the at least one semiconductor chip 130 is joined to the upper surface of the first substrate 110 or the upper surface of the second substrate 120, the package housing 140 covers the at least one semiconductor chip 130 and an area of the second substrate 120, where ultrasonic welding is performed, and the terminals 150 are separated from the first substrate 110, electrically connected to the at least one semiconductor chip 130 through the electric signals 151, and at least one of them is exposed to the outside of the package housing 140. Here, a thickness of the terminals 150 formed inside the package housing 140 is same as or smaller than a thickness of the first substrate 110 and the at least one embossing groove 122 is formed on the upper surface of the second substrate 120. Accordingly, the first substrate 110 and the second substrate 120, which are separated from each other, are formed of a material that enables ultrasonic welding. Thus, the first substrate 110 and the second substrate 120 are joined to each other to lighten weight, a size of the first substrate 110 increases to improve heat radiation effect, and a joining strength between the semiconductor chip 130 and the second substrate 120 increases by the embossing grooves 122.

Firstly, the at least one first substrate 110 may be formed of Al as a single material or an alloy material containing more than 50% of Al. Accordingly, the second substrate 120 is joined to the upper surface of the first substrate 110 by using ultrasonic welding and thus, the at least one first substrate 110 describe above may replace the first substrate 110, which is generally formed of a copper material. Therefore, weight lightening may be realized and the cost of material may be reduced.

Next, the at least one second substrate 120 is joined to the upper surface of the first substrate 110 by using the ultrasonic welding.

The first substrate 110 or the second substrate 120 may include a conductive metal, wherein the conductive metal may have a stacked structure including at least two layers formed of each different metal or each different alloy metal.

Also, the first substrate 110 or the second substrate 120 may have a stacked structure including at least one insulation layer.

For example, the second substrate 120 may be formed of Cu as a single material or an alloy material containing more than 50% of Cu.

Figure 6A:
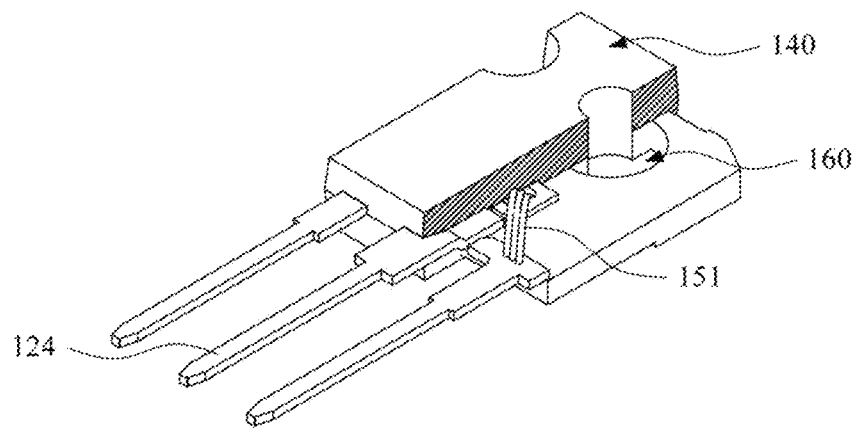
FIGS. 6A to 6C are exploded perspective views of the semiconductor package of FIGS. 5A to 5C.
Figure 6B:
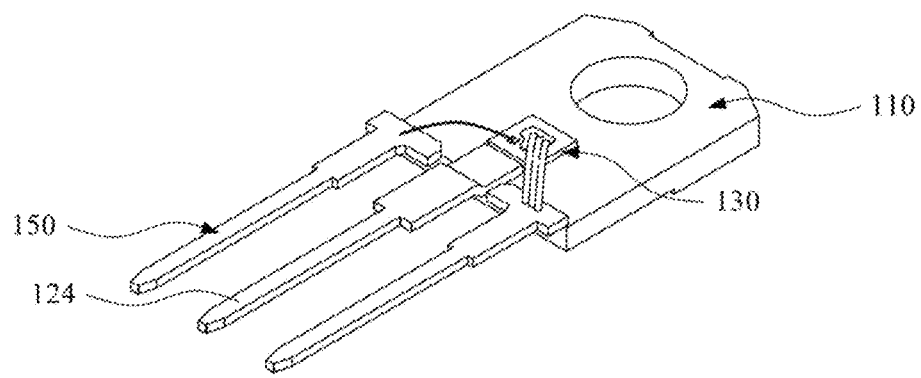
Figure 6C:
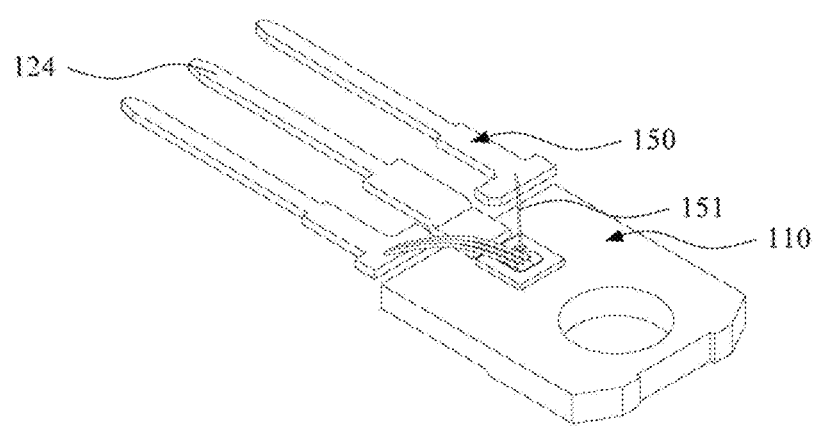
Figure 7:
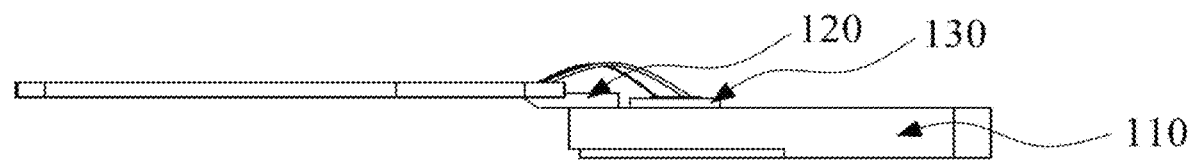
FIG. 7 is a side view of the semiconductor package of FIGS. 5A to 5C.
Figure 8A:
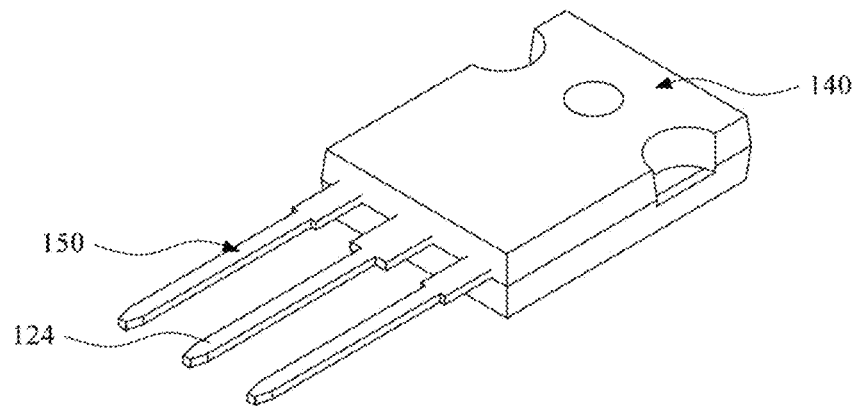
FIGS. 8A to 8C are perspective views illustrating a second example of a semiconductor package according to another embodiment of the present invention.
Figure 8B:
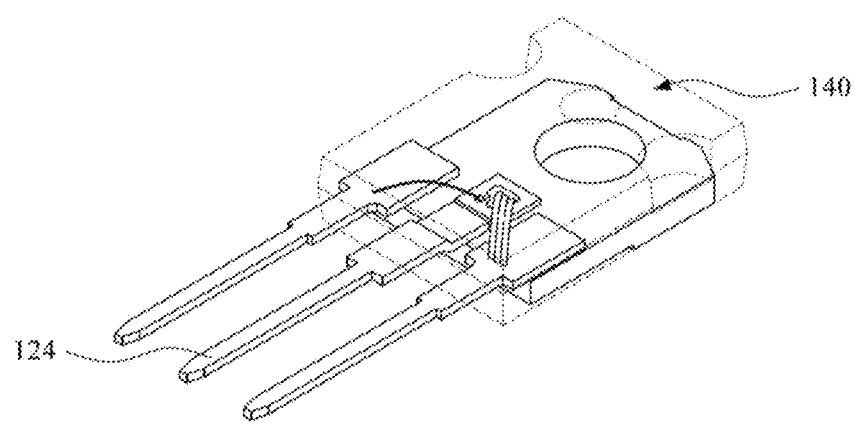
Figure 8C:
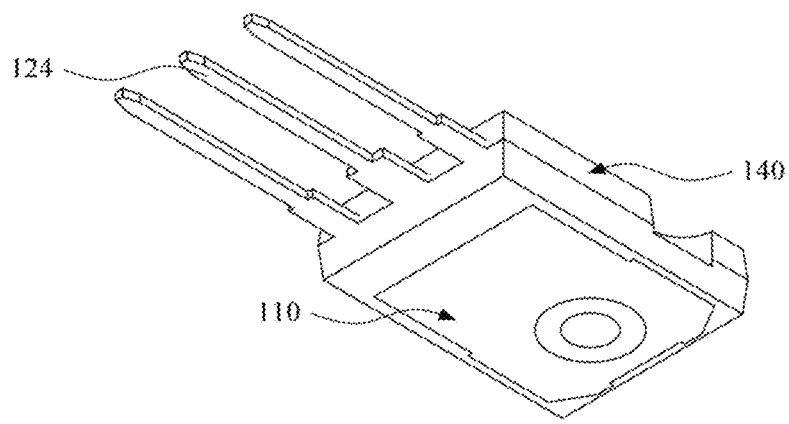
Figure 9A:
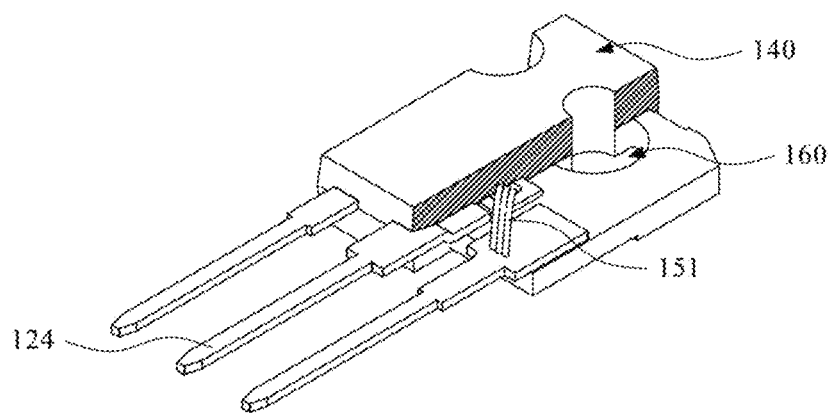
FIGS. 9A to 9C are exploded perspective views of the semiconductor package of FIGS. 8A to 8C.
Figure 9B:
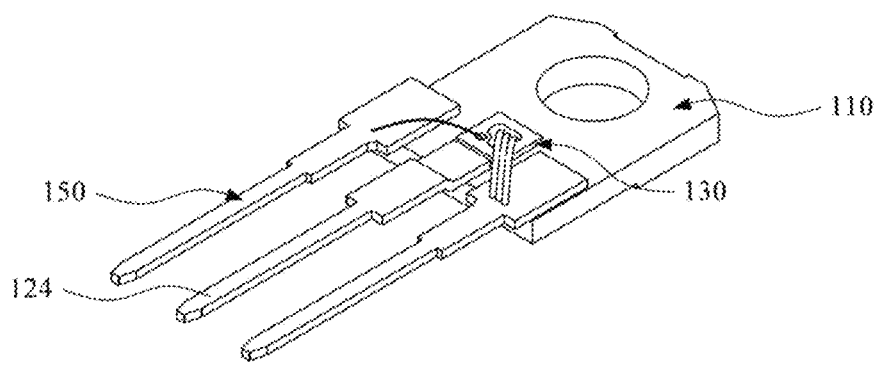
Figure 9C:
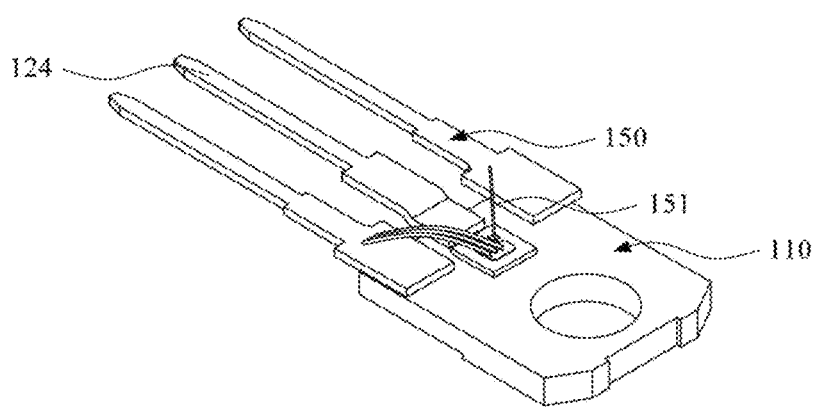
Figure 10:
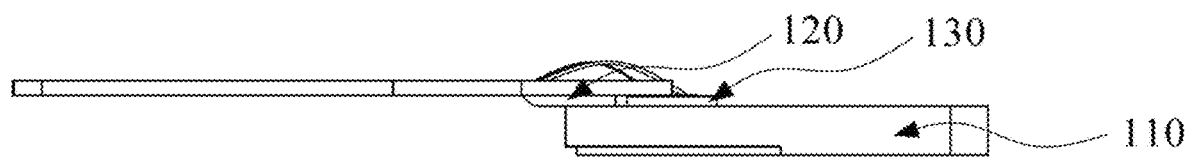
FIG. 10 is a side view of the semiconductor package of FIGS. 8A to 8C.
Figure 11A:
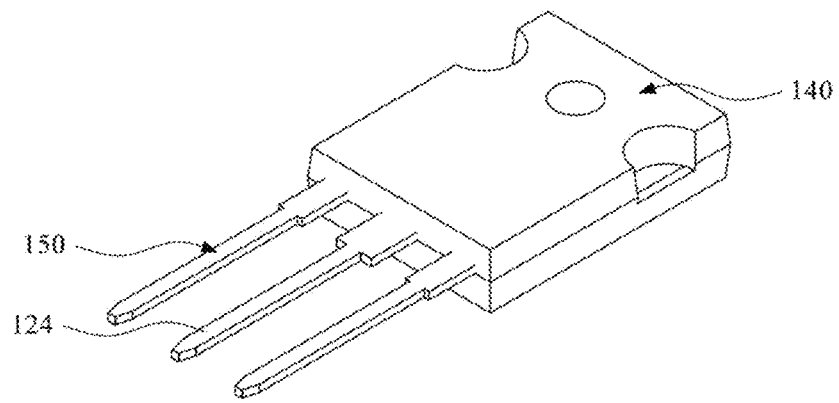
FIGS. 11A to 11O are perspective views illustrating a third example of a semiconductor package according to another embodiment of the present invention.
Figure 11B:
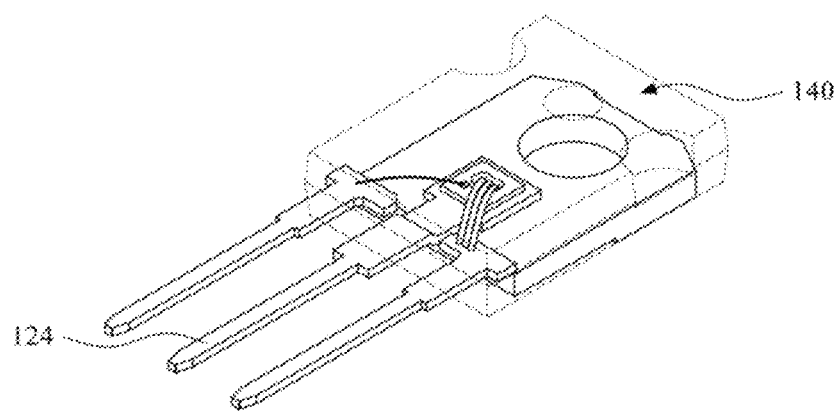
Figure 11C:
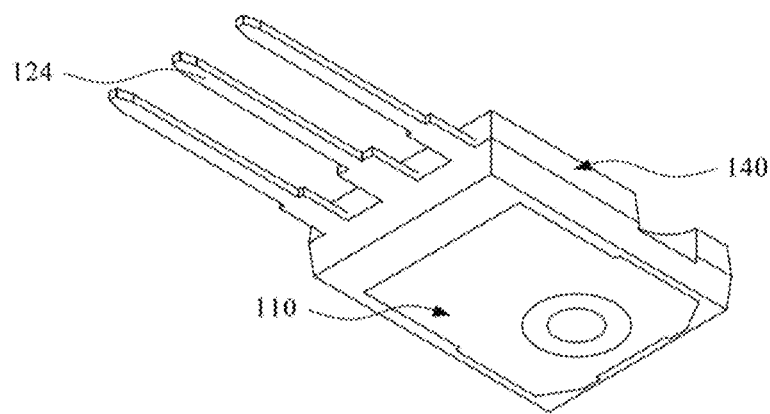

That is, as illustrated in a first example in FIGS. 6A to 6C and a second example in FIGS. 9A to 9C, the second substrate 120 is joined to the upper surface of the first substrate 110 containing Al component by using ultrasonic welding and the semiconductor chip 130 is installed on the upper surface of the first substrate 110 so as not to be overlapped with the second substrate 120.

Figure 12A:
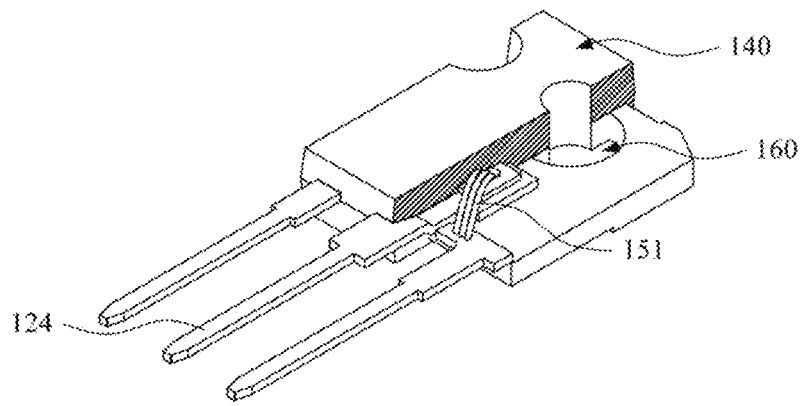
FIGS. 12A to 12C are exploded perspective views of the semiconductor package of FIGS. 11A to 11O.
Figure 12B:
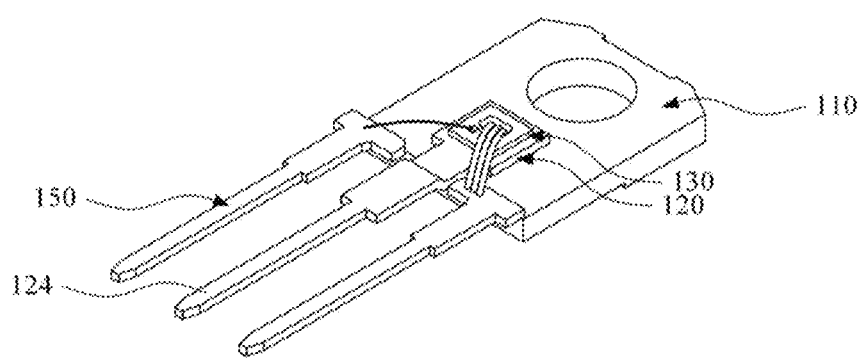
Figure 12C:
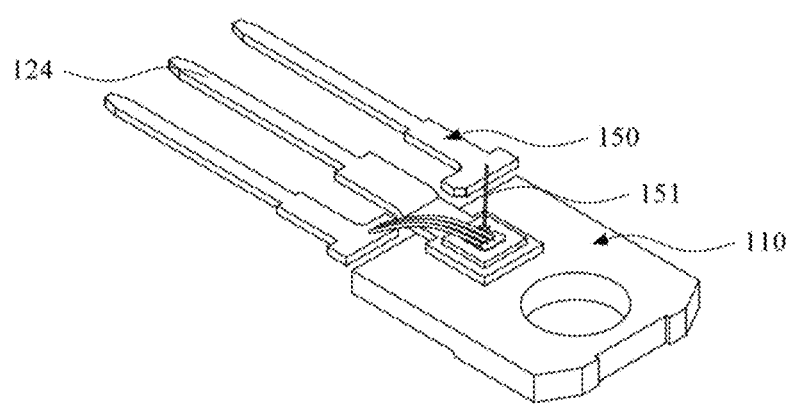
Figure 13:
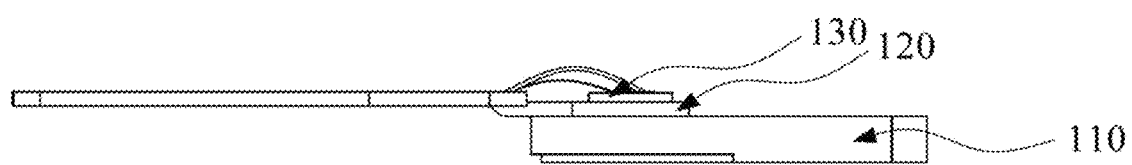
FIG. 13 is a side view of the semiconductor package of FIGS. 11A to 11O.
Figure 14A:
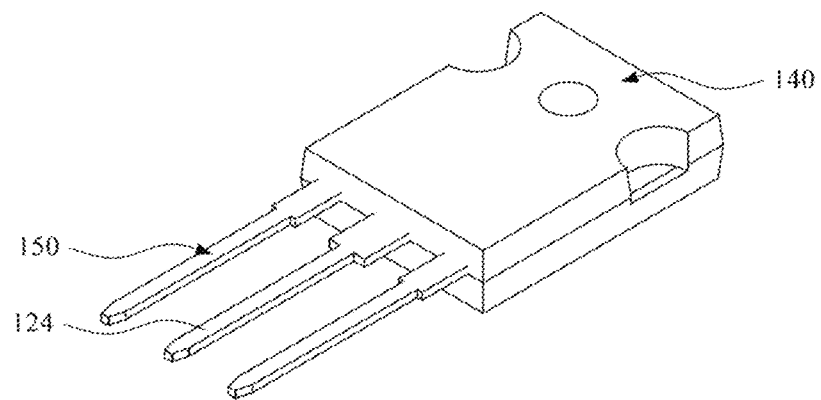
FIGS. 14A to 14C are perspective views illustrating a fourth example of a semiconductor package according to another embodiment of the present invention.
Figure 14B:
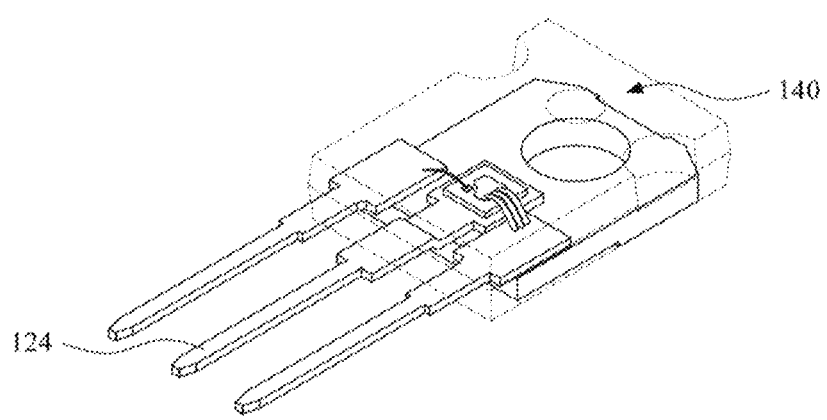
Figure 14C:
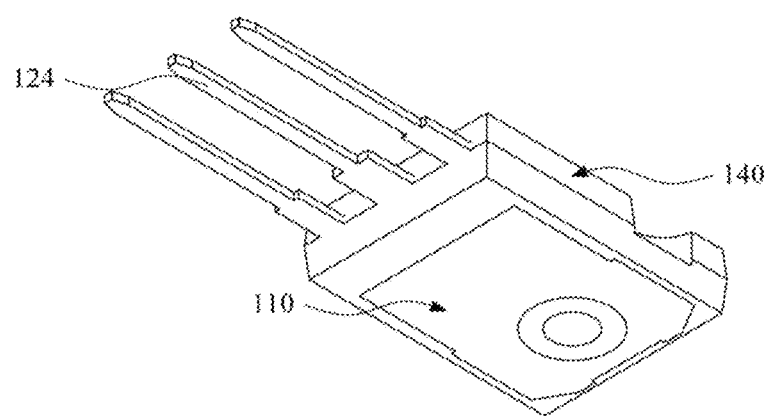
Figure 15A:
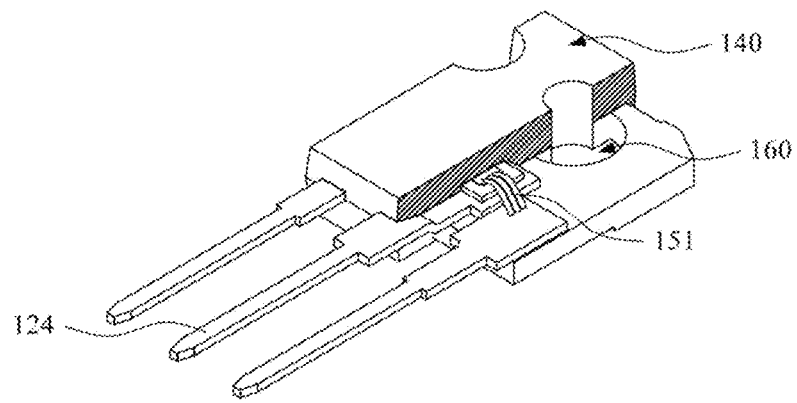
FIGS. 15A to 15C are exploded perspective views of the semiconductor package of FIGS. 14A to 14C.
Figure 15B:
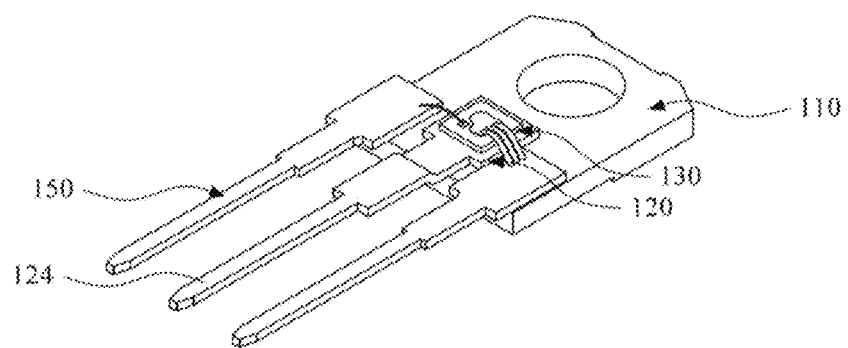
Figure 15C:
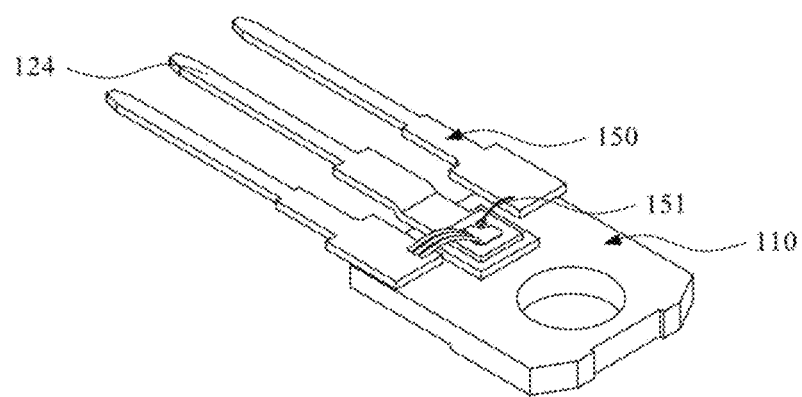
Figure 16:
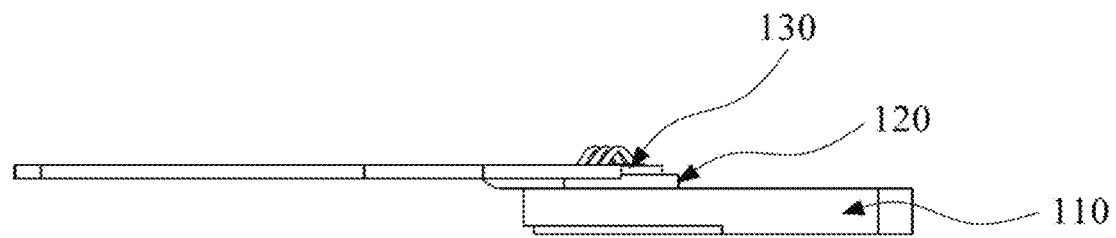
FIG. 16 is a side view of the semiconductor package of FIGS. 15A to 14S.

Also, as illustrated in a third example in FIGS. 12A to 12C and a fourth example in FIGS. 15A to 15C, the second substrate 120 is joined to the upper surface of the first substrate 110 containing Al component by using ultrasonic welding and the semiconductor chip 130 is installed on the upper surface of the second substrate 120.

The first substrate 110 and the second substrate 120 may be formed of a conductive metal containing each different component.

In addition, an area of the first substrate 110 is formed to be greater than an area of the second substrate 120 or a thickness of the first substrate 110 is formed to be greater than a thickness of the second substrate 120. As illustrated in FIGS. 5A, 5B, 5C, 8A, 8B, 8C, 11A, 11B, 110, and 14C, a part of the lower surface of the first substrate 110 or the entire first substrate 110 is exposed to the lower surface of the package housing 140. Accordingly, heat generated from the semiconductor chip 130 may be effectively radiated to the outside of the package housing 140.

As illustrated in FIGS. 6A, 6B, 6C, 9A, 9B, 9C, 12A, 12B, 12C, and 15A, the penetration hole 160 used to combine with a heat sink (not illustrated) may be formed to be connected with the package housing 140 on the first substrate 110 where the second substrate 120 or the semiconductor chip 130 is not joined thereto.

Next, the at least one semiconductor chip 130 may be joined to the upper surface of the first substrate 110, as illustrated in FIGS. 6A, 6B, 6C and 9B, or may be joined to the upper surface of the second substrate 120, as illustrated in FIGS. 12A, 12B, 12C and 15B.

Referring to FIG. 17C, the semiconductor chip 130 may be joined to the upper surface of the second substrate 120 by using the conductive adhesive 121 interposed therebetween.

The at least one embossing groove 122 is formed on the upper surface of the second substrate 120, where the semiconductor chip 130 is installed, and at least a part of the conductive adhesive 121 is applied to the embossing grooves 122 disposed on the surface of the second substrate 120. Accordingly, the joining strength between the second substrate 120 and the semiconductor chip 130 may be increased.

Here, the conductive adhesive 121 may be a solder-related material containing at least any one of Sn, Pb, and Bi or a sinter material containing at least any one of Ag and Cu.

Also, the embossing grooves 122 having a depth of below 100 μm may be formed by ultrasonic welding performed with respect to the second substrate 120 and as illustrated in FIGS. 17A to 18B, the embossing grooves 122 may be formed in various shapes. For example, cross-sections of a V-letter shape (FIG. 18A), a U-letter shape (FIG. 17C), or a polygon may be formed and surface areas of the embossing grooves 122 are maximized. Accordingly, the joining strength between the embossing grooves 122 and the conductive adhesive 121 may be increased.

In addition, the embossing grooves 122 may have a grid-form as illustrated in FIG. 17A, a dotted-form as illustrated in FIG. 17B, or line-forms so that surface areas of the embossing grooves 122 are maximized and the joining strength between the embossing grooves 122 and the conductive adhesive 121 may be increased.

When the embossing grooves 122 are formed by ultrasonic welding performed with respect to the second substrate 120, the burrs 123 are necessarily generated. As illustrated in FIG. 18B, at least one burr 123 may be formed around the at least one embossing groove 122 and a height of the burr 123 may be formed not to exceed 100 μm.

Next, the package housing 140 covers the at least one semiconductor chip 130 and an area of the first substrate 110 and the second substrate 120, where ultrasonic welding is performed, wherein the package housing 140 is an insulator for protecting semiconductor circuits and may be formed using an epoxy molding compound (EMC), polyphenylene sulfide (PPS), or polybutylene terephthalate (PBT).

Then, the at least one terminal 150 is physically separated from the first substrate 110. As illustrated in FIGS. 6A, 6B, 6C and 12C, the at least one terminal 150 is formed so as not to be overlapped with the upper surface of the first substrate 110 or as illustrated in FIGS. 9A, 9B, 9C and 15C, the at least one terminal 150 may be overlapped with the upper surface of the first substrate 110 and instead, may be physically separated from the first substrate 110. Also, the at least one terminal 150 is electrically connected to the at least one semiconductor chip 130 through the electric signals 151 and is exposed to the outside of the package housing 140 so as to electrically connect to external terminals.

The electric signals 151 may be wires or metal clips.

Also, the first substrate 110 may be formed of Al as a single material or an alloy material containing more than 50% of Al.

Although not illustrated in the drawings, the thickness d1 of the terminal 150 formed inside the package housing 140 may be formed to be smaller than (FIG. 4C) or same as (FIG. 4E) the thickness d2 of the first substrate 110, as illustrated in FIGS. 4C and 4E.

Also, although not illustrated in the drawings, the thickness d3 of the second substrate 120 may be same as the thickness d1 of the terminal 150, where a plated layer is excepted, as illustrated in FIG. 4C, or the thickness d2 of the first substrate 110 may be same as the thickness d1 of the terminal 150, where a plated layer is excepted, as illustrated in FIG. 4E.

As described above, the second substrate 120, the second substate terminal 124, or both the second substrate 120 and the second substate terminal 124 may be formed of Cu as a single material or an alloy material containing more than 50% of Cu.

In addition, the at least one terminal 150 may be formed of Al or Cu as a single material or an alloy material containing more than 50% of Al or Cu.

The first substrate 110, the second substrate 120, both the first substrate 110 and the second substrate 120, the second substrate terminal 124, or the at least one terminal 150 may each include a plated layer on at least one surface thereof. Here, the plated layer may be formed of a single layer or may have a stacked structure including two or more layers formed of a same metal or each different metal.

Moreover, the plated layer may be a single layer including Ni as a single material or a Ni plated layer where one or more layers formed of an alloy material containing more than 70% of Ni are stacked. Here, a thickness of the Ni plated layer may be 0.1 μm to 10 μm.

The most outer plated layer of the at least one terminal 150 may contain Sn.

Accordingly, in the semiconductor package according to another embodiment of the present invention, instead of a substrate formed of a high-priced copper material, a material that enables ultrasonic welding is used to form the first substrate and the second substrate, which are separated from each other. Thus, the substrates are joined to each other to lighten weight and thereby, battery consumption and the cost of material may be finally reduced after being applied to electric vehicles. Also, the semiconductor chip may be selectively installed on the first substrate or the second substrate, a size and a thickness of the substrate exposed to the outside of the package housing are relatively formed to be greater so as to improve heat radiation effect, and the joining strength between the semiconductor chip and the substrate may be increased by the embossing grooves and the burrs.

According to the present invention, the first substrate and the second substrate, which are separated from each other, are formed using a material that enables ultrasonic welding. Thus, the substrates are joined to each other to lighten weight and thereby, battery consumption and the cost of material may be finally reduced after being applied to electric vehicles. Also, the semiconductor chip may be selectively installed on the first substrate or the second substrate, a size and a thickness of the substrate exposed to the outside of the package housing are relatively formed to be greater so as to improve heat radiation effect, and the joining strength between the semiconductor chip and the substrate may be increased by the embossing grooves and the burrs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   at least one first substrate comprising at least one first substrate terminal extended therefrom;
   at least one second substrate joined to the upper surface of the first substrate using ultrasonic welding;
   at least one semiconductor chip joined to the upper surface of the second substrate;
   a package housing covering the at least one semiconductor chip and an area of the second substrate, where ultrasonic welding is performed; and
   terminals separated from the first substrate, electrically connected to the at least one semiconductor chip through electric signals, and at least one of them is exposed to the outside of the package housing,
   wherein a thickness of the terminals formed inside the package housing is same as or smaller than a thickness of the first substrate and the second substrate comprises at least one embossing groove on the upper surface thereof.

2. The semiconductor package of claim 1, wherein the first substrate or the second substrate comprises a conductive metal or an insulation layer where at least one layer is stacked.

3. The semiconductor package of claim 1, wherein the first substrate, the second substrate, both the first substrate and the second substrate, the first substrate terminal, or the at least one terminal each comprises a plated layer on at least one surface thereof.

4. A semiconductor package comprising:
   at least one first substrate;
   at least one second substrate joined to the upper surface of the first substrate using ultrasonic welding and comprising second substate terminals extended therefrom;
   at least one semiconductor chip joined to the upper surface of the first substrate or the upper surface of the second substrate;
   a package housing covering the at least one semiconductor chip and an area of the second substrate, where ultrasonic welding is performed; and
   terminals separated from the first substrate, electrically connected to the at least one semiconductor chip through electric signals, and at least one of them is exposed to the outside of the package housing,
   wherein a thickness of the terminals formed inside the package housing is same as or smaller than a thickness of the first substrate and the second substrate comprises at least one embossing groove on the upper surface thereof.

5. The semiconductor package of claim 1, wherein the semiconductor chip is joined to the upper surface of the first substrate or the upper surface of the second substrate by using a conductive adhesive interposed therebetween.

6. The semiconductor package of claim 5, wherein at least a part of the conductive adhesive is applied to the embossing grooves disposed on the surface of the second substrate.

7. The semiconductor package of claim 1, wherein the at least one terminal is arranged to be spaced apart from the upper surface of the first substrate at a regular interval.

8. The semiconductor package of claim 1, wherein an area of the first substrate is greater than an area of the second substrate or a thickness of the first substrate is greater than a thickness of the second substrate.

9. The semiconductor package of claim 1, wherein the first substrate comprises a penetration hole used to combine with a heat sink thereon where the second substrate or the semiconductor chip is not joined thereto.

10. The semiconductor package of claim 1, wherein the embossing grooves have cross-sections of a V-letter shape, a U-letter shape, or a polygon, or a grid-form, a dotted-form, or line-forms.

11. The semiconductor package of claim 1, further comprising at least one burr formed around the at least one embossing groove.

12. The semiconductor package of claim 4, wherein the first substrate, the second substrate, both the first substrate and the second substrate, the second substate terminal, or the at least one terminal each comprises a plated layer on at least one surface thereof.

13. The semiconductor package of claim 4, wherein the first substrate or the second substrate comprises a conductive metal or an insulation layer where at least one layer is stacked.

14. The semiconductor package of claim 12, wherein the semiconductor chip is joined to the upper surface of the first substrate or the upper surface of the second substrate by using a conductive adhesive interposed therebetween.

15. The semiconductor package of claim 14, wherein at least a part of the conductive adhesive is applied to the embossing grooves disposed on the surface of the second substrate.

16. The semiconductor package of claim 12, wherein the at least one terminal is arranged to be spaced apart from the upper surface of the first substrate at a regular interval.

17. The semiconductor package of claim 12, wherein an area of the first substrate is greater than an area of the second substrate or a thickness of the first substrate is greater than a thickness of the second substrate.

18. The semiconductor package of claim 12, wherein the first substrate comprises a penetration hole used to combine with a heat sink thereon where the second substrate or the semiconductor chip is not joined thereto.

19. The semiconductor package of claim 12, wherein the embossing grooves have cross-sections of a V-letter shape, a U-letter shape, or a polygon, or a grid-form, a dotted-form, or line-forms.

20. The semiconductor package of claim 12, further comprising at least one burr formed around the at least one embossing groove.

* * * * *

UNITED STATES PATENT AND TRADEMARK OFFICE
CERTIFICATE OF CORRECTION

| | | |
|---|---|---|
| PATENT NO. | : 11,417,577 B2 | Page 1 of 1 |
| APPLICATION NO. | : 17/227351 | |
| DATED | : August 16, 2022 | |
| INVENTOR(S) | : Yun Hwa Choi | |

It is certified that error appears in the above-identified patent and that said Letters Patent is hereby corrected as shown below:

In the Claims

Column 12, Line 31; In Claim 14, "claim 12" should be changed to --claim 4--.

Column 12, Line 39; In Claim 16, "claim 12" should be changed to --claim 4--.

Column 12, Line 42; In Claim 17, "claim 12" should be changed to --claim 4--.

Column 12, Line 46; In Claim 18, "claim 12" should be changed to --claim 4--.

Column 12, Line 50; In Claim 19, "claim 12" should be changed to --claim 4--.

Column 12, Line 54; In Claim 20, "claim 12" should be changed to --claim 4--.

Signed and Sealed this
Eleventh Day of October, 2022

Katherine Kelly Vidal
*Director of the United States Patent and Trademark Office*